United States Patent
Loreck

(10) Patent No.: US 6,639,539 B1
(45) Date of Patent: Oct. 28, 2003

(54) SYSTEM AND METHOD FOR EXTENDING THE DYNAMIC RANGE OF AN ANALOG-TO-DIGITAL CONVERTER

(75) Inventor: Heinz Loreck, Clayton, CA (US)

(73) Assignee: BEI Technologies, Inc., San Francisco, CA (US)

( * ) Notice: Subject to any disclaimer, the term of this patent is extended or adjusted under 35 U.S.C. 154(b) by 0 days.

(21) Appl. No.: 10/278,827

(22) Filed: Oct. 22, 2002

(51) Int. Cl.[7] .................................................. H03M 1/12
(52) U.S. Cl. ......................................... 341/155; 341/139
(58) Field of Search ................................... 341/155, 139, 341/110, 118, 172, 120

(56) References Cited

U.S. PATENT DOCUMENTS 5,329,281 A  *  7/1994  Baumgartner et al. ...... 341/139

* cited by examiner

*Primary Examiner*—Brian Young
*Assistant Examiner*—Joseph J Lauture
(74) *Attorney, Agent, or Firm*—Edward S. Wright

(57) ABSTRACT

System and method for improving the dynamic range of an A/D converter in which operation the A/D converter is monitored, and an offset signal is combined with an analog input signal to maintain the operation of the A/D converter within the dynamic range.

8 Claims, 2 Drawing Sheets

SYSTEM AND METHOD FOR EXTENDING THE DYNAMIC RANGE OF AN ANALOG-TO-DIGITAL CONVERTER

This invention pertains generally to the conversion of signals from analog to digital form and, more particularly, to a system and method for extending the dynamic range of an analog-to-digital (A/D) converter.

Sensor systems with a given range of bias over temperature are typically calibrated for zero output stability by calibration over temperature in the analog domain prior to digitization. A more cost effective and stable way to do the calibration is to do it in the digital domain. However, in such systems, the dynamic range of the A/D converter has to be shared between the input signal and the offset variation, and the dynamic range of the calibrated signal is reduced.

One way to overcome the reduction in dynamic range is to reduce the analog scaling of the signal. However, that results in a lower signal-to-noise ratio and reduced resolution of the digital signal.

The reduction in resolution can be avoided-by using an A/D converter with higher resolution. While that will maintain or improve the resolution of the digital signal, it requires a more expensive A/D converter.

It is in general an object of the invention to provide a new and improved system and method for extending the dynamic range of an A/D converter.

Another object of the invention is to provide an improved system and method of the above character which overcome the limitations and disadvantages of the prior art.

These and other objects are achieved in accordance with the invention by providing a system and method for improving the dynamic range of an A/D converter in which operation the A/D converter is monitored, and an offset signal is combined with an analog input signal to maintain the operation of the A/D converter within the dynamic range.

Figure 1:
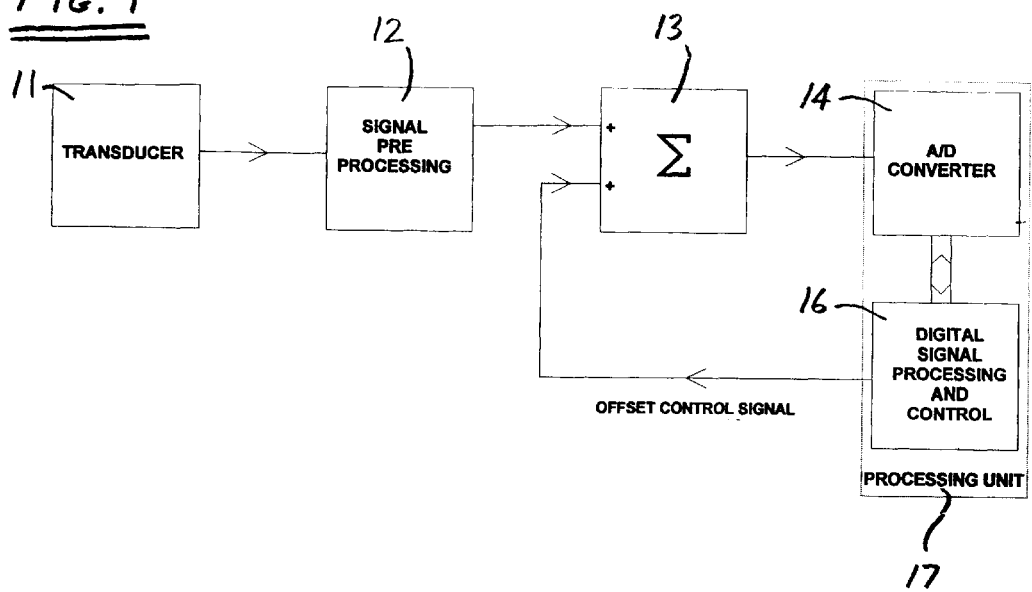
FIG. 1 is a block diagram of one embodiment of a system for improving the dynamic range of an A/D converter in accordance with the invention.

In FIG. 1, the system is shown in connection with a transducer 11 which provides an analog electrical signal corresponding to a physical property to be measured. The signal from the transducer is applied to a preprocessing circuit 12, and the preprocessed signal is applied to a first input of a summation circuit 13. The output of the summation circuit is connected to the input of an A/D converter 14.

Operation of the A/D converter is monitored by a digital signal processing and control circuit 16 which applies an offset control signal to a second input of the summation circuit where it is combined with the preprocessed analog signal. Together, A/D converter 14 and processing and control circuit 16 constitute a processing unit 17.

The processing and control circuit produces signals of three different levels, depending on where the A/D converter is operating relative to its dynamic range. In the embodiment of FIG. 1, when the A/D converter is operating within its dynamic range, the offset control signal is zero. When the converter reaches the upper limit of its dynamic range, the processing and control circuit produces a negative offset signal to bring the analog signal from the summation circuit back into the dynamic range of the A/D converter. When the compensated signal is back within the dynamic range, the offset signal returns to zero. When the A/D converter reaches the lower limit of its dynamic range, the processing and control circuit produces a positive offset signal to bring the analog signal from the summation circuit back into the dynamic range of the A/D converter. When the compensated signal is back within the dynamic range, the offset signal returns to zero.

Following AND conversion, the digitized signal is processed to compensate for the offset signal so that the digital output signal will correctly represent the original analog input signal. This is done by subtracting the digital equivalent of the analog offset signal from the digitized signal. For a given converter, the offset signal has a known, constant value which can be determined either by design or by measurement during calibration of the system.

Figure 2:
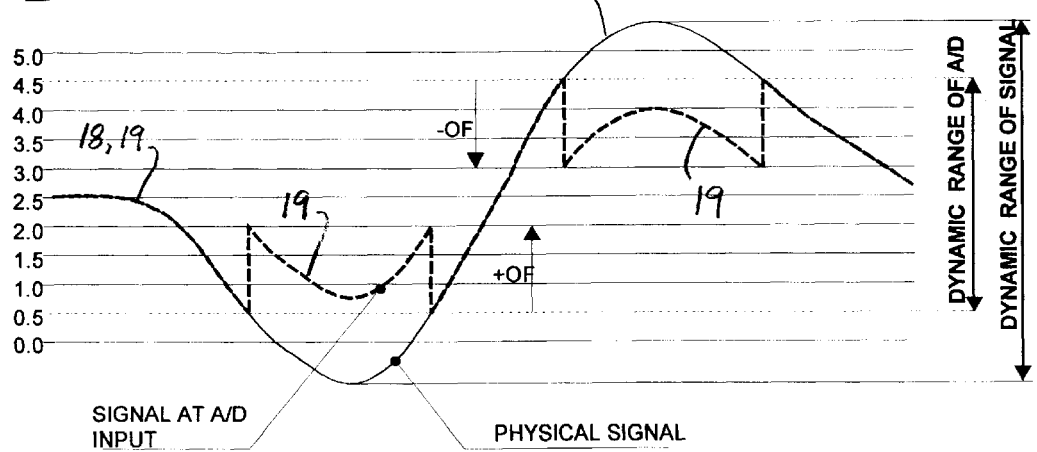
FIG. 2 is a graphical representation illustrating the manner in which the dynamic range of an A/D converter is improved in the embodiment of FIG. 1.

Operation of the embodiment of FIG. 1 is illustrated in the waveform diagram of FIG. 2. In this example, the A/D converter has a dynamic range of 0.5 to 4.5 volts, and the preprocessed analog signal 18 has a dynamic range of about −0.5 to 5.5 volts. As long as the analog signal remains between 0.5 and 4.5 volts, no offset is applied to the summation circuit. When the analog signal drops to the lower threshold of the dynamic range of the A/D converter (0.5 volt), a positive offset voltage of 1.5 volts is added to the analog voltage, bringing the voltage at the input of the converter (waveform 19) back within the dynamic range. As long as the analog input signal remains below the lower threshold voltage, the offset voltage is applied. When the analog input signal rises back to the lower threshold level, the offset voltage is removed.

When the analog signal reaches the upper threshold of the dynamic range of the A/D converter (4.5 volts), a negative offset voltage of 1.5 volts is added to the analog voltage, bringing the voltage at the input of the A/D converter back within the dynamic range. As long as the analog input signal remains above the upper threshold voltage, the offset voltage is applied. When the analog input signal drops back to the lower threshold level, the offset voltage is removed. Thus, the A/D converter continues to operate within its dynamic range even though the analog input signal may swing outside it.

Figure 3:
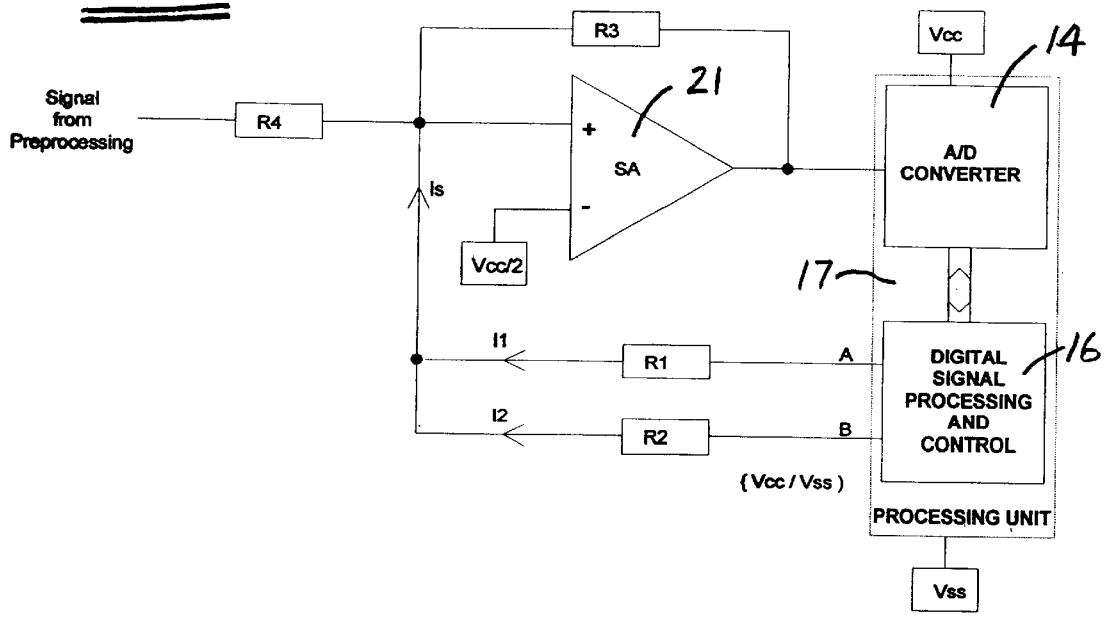
FIGS. 3–4 are block diagrams of additional embodiments of a system for improving the dynamic range of an A/D converter in accordance with the invention.

The embodiment of FIG. 3 is generally similar to that of FIG. 1, and like reference numerals designate corresponding elements in the two embodiments. In the embodiment of FIG. 3, the preprocessed analog signal is applied to the noninverting input of a summing amplifier 21 through an input resistor R4. The output of the amplifier is connected to the input of A/D converter 14, and a feedback resistor R3 is connected between the output and the noninverting input of the amplifier. In this embodiment, digital signal processing and control circuit 16 provides two output signals which are applied to the noninverting input of the amplifier by resistors of equal value R1, R2. The inverting input of the amplifier is connected to a voltage $V_{cc}/2$.

When the analog signal at the output of amplifier 19 is within the dynamic range of A/D converter 14, processing and control circuit 16 applies voltages of $+V_{cc}$ to resistor R1 and 0 to resistor R2. With these voltages applied to the resistors, the currents $I_1$, $I_2$ flowing through the resistors are $V_{cc}/2R1$ and $-V_{cc}/2R1$. Since R1=R2, the currents cancel each other, and the offset current $I_s$ applied to the summing node at the noninverting input of the amplifier is zero.

When the analog signal at the output of amplifier 19 is above the upper threshold of the dynamic range of the A/D converter, the processing and control circuit applies a voltage of $+V_{cc}$ both to both resistors R1, R2. With this voltage applied to both resistors, the current flowing into the summing node is $$I_s=2V_{cc}/(R1+R2),$$

and with R1=R2, a negative offset voltage is applied to the summing node:

$$V_{OFFSET}=-2V_{cc}R3/(R1+R2).$$

When the analog signal at the output of amplifier 19 is below the lower threshold of the dynamic range of the A/D converter, the processing and control circuit applies a voltage of 0 to both resistors R1, R2. With 0 volts applied to both resistors, the current flowing into to the summing node is $$I_s=-2V_{cc}/(R1+R2),$$

and with R1=R2, a positive offset voltage is applied to the summing node:

$$V_{OFFSET}=2V_{cc}R3/(R1+R2).$$

Figure 4:
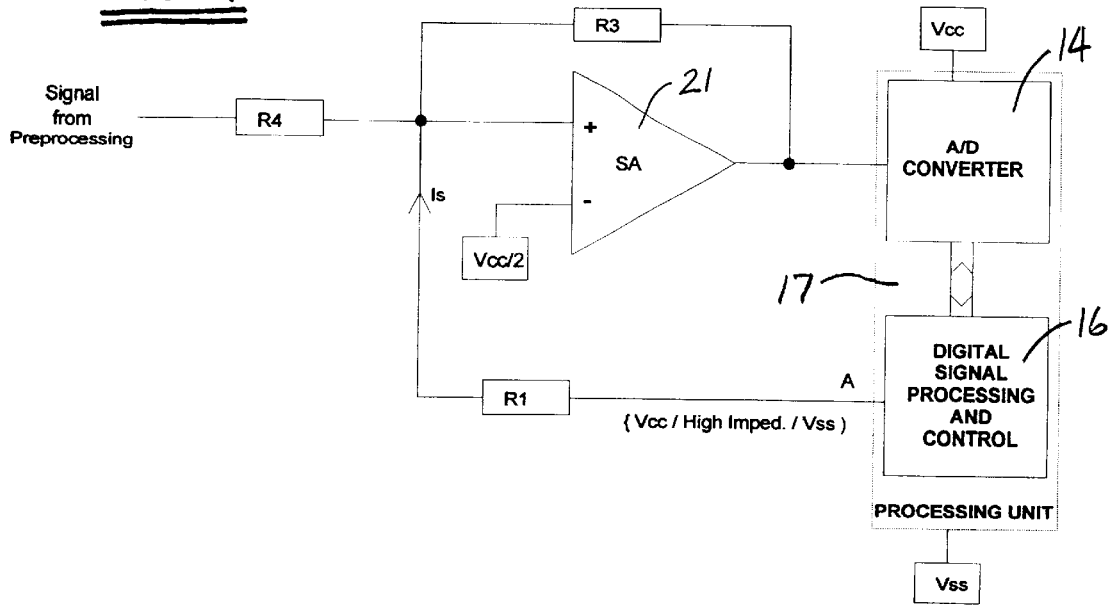

The embodiment of FIG. 4 is generally similar to the embodiment of FIG. 3 except that in this embodiment, processing and control circuit 16 has a single tristate output, and the three offset levels are applied to the summing node at the noninverting input of summing amplifier 13 through a single resistor R1. When the input signal to the A/D converter is below the lower limit of the dynamic range of the converter, the tristate signal has a level of $V_{cc}$, and when the input signal is above the upper limit of the range, the tristate signal has a relatively negative level of $V_{ss}$. When the input signal is within the dynamic range of the A/D converter, the processing and control circuit presents a high impedance to resistor R1, and no offset occurs.

With all of the offset signals being applied through the same resistor, the embodiment of FIG. 4 not only simplifies the system by reducing the number of parts, it also eliminates any possibility of error arising from a mismatch of multiple resistors in the system.

In each of the disclosed embodiments, the accuracy of the compensation provided by the offset signal can be improved by measuring the magnitude of the offset during production of the system and storing the compensation values in the memory of the processing unit.

In safety critical applications, the response to an offset command can be monitored by software as long as the settling time of the commanded offset is low compared to the lowest time constant of the signal, as determined by the bandwidth of the signal.

The invention has a number of important features and advantages. It extends the dynamic range of an A/D converter so that it can process larger analog signals without sacrificing the any of the dynamic range of the converter and without reduction in the analog scaling of the signal.

It is apparent from the foregoing that a new and improved system and method for extending the dynamic range of an AND converter have been provided. While only certain presently preferred embodiments have been described in detail, as will be apparent to those familiar with the art, certain changes and modifications can be made without departing from the scope of the invention as defined by the following claims.

What is claimed is:

1. A system for improving the dynamic range of an A/D converter, comprising: an analog summing amplifier having first and second input terminals of opposite polarity and an output terminal which is connected to the input of the A/D converter; means for applying an analog input signal to the first input terminal; a feedback resistor connected between the output terminal and the first input terminal; means for applying a voltage $V_{CC}/2$ to the second input terminal; first and second resistors of equal value connected to the first input terminal; and means for monitoring operation of the A/D converter and connecting the first resistor to $V_{CC}$ and the second resistor to 0 volts when the A/D converter is operating within its dynamic range, connecting both the first resistor and the second resistor to $V_{CC}$ when the A/D converter reaches the upper limit of its dynamic range, and connecting both the first resistor and the second resistor to 0 volts when the A/D converter reaches the lower limit of its dynamic range.

2. A method of improving the dynamic range of an A/D converter, comprising the steps of:

applying an analog input signal to a first input of an analog summing amplifier having a second input of opposite polarity to the first input and an output which is connected to the input of the A/D converter, a feedback resistor connected between the output and the first input, and first and second resistors of equal value connected to the first input;

applying a voltage $V_{CC}/2$ to the second input of the amplifier;

monitoring the output of the A/D converter to determine whether the A/D converter is operating within its dynamic range;

connecting the first resistor to $V_{CC}$ and the second resistor to 0 volts when the A/D converter is operating within its dynamic range;

connecting both the first resistor and the second resistor to $V_{CC}$ when the A/D converter reaches the upper limit of its dynamic range; and connecting both the first resistor and the second resistor to 0 volts when the A/D converter reaches the lower limit of its dynamic range.

3. A system for improving the dynamic range of an AND converter, comprising: an analog summing amplifier having first and second input terminals and an output terminal which is connected to the input of the A/D converter, means for applying an analog input signal to the first input terminal of the amplifier, a feedback resistor connected between the output terminal and the first input terminal, means for applying a reference voltage to a second input terminal of the summing amplifier, an offset resistor connected to the second input terminal, and means connected to the output of the A/D converter for applying an offset signal having a first level to the offset resistor when the A/D converter is operating in its dynamic range, applying a an offset signal having a second level to the offset resistor when the A/D converter reaches the upper limit of its dynamic range, and applying an offset signal having a third level to the offset resistor when the A/D converter reaches the lower limit of its dynamic range.

4. The system of claim 3 including means for processing a digitized signal from the A/D converter to compensate digitally for the offset signal and provide a digital output signal which represents the analog input signal without the offset signal.

5. The system of claim 4 wherein the means for processing the digitized signal includes means for subtracting a digital representation of the offset signal from the digitized signal.

6. A method of improving the dynamic range of an A/D converter, comprising the steps of:

applying an analog input signal to the first input of an analog summing amplifier having an output which is connected to the input of the A/D converter, a feedback resistor connected between the output and the first input, and an offset resistor connected to the first input;

applying a reference voltage to a second input of the amplifier;

monitoring the output of the A/D converter to determine whether the A/D converter is operating within its dynamic range;

applying a first offset signal to the offset resistor when the A/D converter is operating in its dynamic range;

applying a second offset signal to the offset resistor when the A/D converter reaches the upper limit of its dynamic range; and applying a third offset signal to the offset resistor when the A/D converter reaches the lower limit of its dynamic range.

7. The method of claim 6 including the step of processing a digitized signal from the A/D converter to compensate digitally for the offset signals and provide a digital output signal which represents the analog input signal without the offset signals.

8. The method of claim 7 wherein a digital representation of the offset signal is subtracted from the digitized signal.

* * * * *